(12) United States Patent
Lee et al.

(10) Patent No.: US 8,502,334 B2
(45) Date of Patent: Aug. 6, 2013

(54) IMAGE SENSOR AND METHOD FOR MANUFACTURING THE SAME

(75) Inventors: Kil-Sung Lee, Uiwang-si (KR);
Jae-Hyun Kim, Uiwang-si (KR);
Chang-Min Lee, Uiwang-si (KR);
Eui-June Jeong, Uiwang-si (KR);
Min-Soo Kim, Uiwang-si (KR);
Hwan-Sung Cheon, Uiwang-si (KR);
Tu-Won Chang, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 24 days.

(21) Appl. No.: 13/236,851

(22) Filed: Sep. 20, 2011

(65) Prior Publication Data

US 2012/0007200 A1    Jan. 12, 2012

Related U.S. Application Data

(63) Continuation-in-part of application No. PCT/KR2009/007055, filed on Nov. 27, 2009.

(30) Foreign Application Priority Data

Apr. 9, 2009 (KR) .................. 10-2009-0030962

(51) Int. Cl.
| | |
|---|---|
| *H01L 31/0232* | (2006.01) |
| *H01L 31/0203* | (2006.01) |
| *H01L 27/146* | (2006.01) |
| *H01L 21/00* | (2006.01) |
| *H01L 21/302* | (2006.01) |
| *H01L 21/469* | (2006.01) |
| *C07D 303/40* | (2006.01) |
| *C08K 3/22* | (2006.01) |
| *C08F 222/40* | (2006.01) |

(52) U.S. Cl.
USPC ........... 257/436; 257/432; 257/433; 257/434; 257/435; 257/E31.127; 438/703; 438/781; 438/70; 522/170; 524/413; 524/432; 524/434; 524/548

(58) Field of Classification Search
USPC 438/703, 781, 70; 430/285.1; 257/E31.127, 257/E21.255, E21.259, E21.24, E31, 432–436; 522/170; 524/413, 432, 434, 548
See application file for complete search history.

(56) References Cited

U.S. PATENT DOCUMENTS

| | | | |
|---|---|---|---|
| 5,362,697 | A | 11/1994 | Fung et al. |
| 5,631,703 | A | 5/1997 | Hamilton, Jr. et al. |

(Continued)

FOREIGN PATENT DOCUMENTS

| | | |
|---|---|---|
| JP | 05-070528 | 3/1993 |
| JP | 05-148411 | 6/1993 |

(Continued)

OTHER PUBLICATIONS

International Search Report and Written Opinion in counterpart International Application No. PCT/KR2009/007055 dated May 2, 2011, pp. 1-10.

(Continued)

*Primary Examiner* — Julio J Maldonado
*Assistant Examiner* — Cory Eskridge
(74) *Attorney, Agent, or Firm* — Summa, Additon & Ashe, P.A.

(57) ABSTRACT

Disclosed is an image sensor including a photo-sensing device, a color filter positioned on the photo-sensing device, a microlens positioned on the color filter, and an insulation layer positioned between the photo-sensing device and the color filter, and including a trench exposing the photo-sensing device and a filler filled in the trench. The filler has light transmittance of about 85% or more at a visible ray region, and a higher refractive index than the insulation layer. A method of manufacturing the image sensor is also provided.

16 Claims, 2 Drawing Sheets

U.S. PATENT DOCUMENTS

| | | | |
|---|---|---|---|
| 5,854,091 A | 12/1998 | Back et al. | |
| 6,242,730 B1 | 6/2001 | Lin et al. | |
| 6,512,220 B1 | 1/2003 | Park | |
| 7,167,629 B2* | 1/2007 | Mune et al. | 385/143 |
| 7,851,789 B2* | 12/2010 | Lee et al. | 257/40 |
| 7,972,890 B2* | 7/2011 | Oh et al. | 438/70 |
| 8,003,429 B2* | 8/2011 | Lee et al. | 438/70 |
| 8,187,905 B2* | 5/2012 | Yin et al. | 438/57 |
| 2001/0044166 A1 | 11/2001 | Park et al. | |
| 2006/0147703 A1 | 7/2006 | Walker et al. | |
| 2006/0180885 A1 | 8/2006 | Rhodes | |
| 2006/0255463 A1 | 11/2006 | Won | |
| 2006/0280878 A1 | 12/2006 | Suezaki et al. | |
| 2007/0210395 A1 | 9/2007 | Maruyama et al. | |
| 2008/0158675 A1 | 7/2008 | Fukushige et al. | |
| 2008/0161444 A1 | 7/2008 | Hayashi et al. | |
| 2008/0230864 A1 | 9/2008 | Lee | |
| 2009/0130792 A1* | 5/2009 | Lee et al. | 438/70 |
| 2009/0146236 A1* | 6/2009 | Lee et al. | 257/432 |
| 2009/0208854 A1 | 8/2009 | Choi et al. | |
| 2011/0006386 A1* | 1/2011 | Lee et al. | 257/432 |
| 2012/0007200 A1 | 1/2012 | Lee et al. | |

FOREIGN PATENT DOCUMENTS

| | | | |
|---|---|---|---|
| JP | 05-204180 | | 8/1993 |
| JP | 7-172032 | | 7/1995 |
| JP | 7-235655 | | 9/1995 |
| JP | 10-066094 | | 3/1998 |
| JP | 11-354763 | | 12/1999 |
| JP | 2001-196366 A | | 7/2001 |
| JP | 2004-341121 | | 12/2004 |
| JP | 2005171051 A | * | 6/2005 |
| JP | 2005-278213 | | 10/2005 |
| JP | 2006-128383 | | 5/2006 |
| JP | 2006128383 A | * | 5/2006 |
| JP | 2008-081726 A | | 4/2008 |
| JP | 2008-133379 A | | 6/2008 |
| JP | 2008-294058 | | 12/2008 |
| JP | 2008294058 A | * | 12/2008 |
| KR | 1998-056215 B1 | | 5/1999 |
| KR | 10-2001-0061335 A | | 7/2001 |
| KR | 2002-039125 A | | 5/2002 |
| KR | 2003-002899 A | | 1/2003 |
| KR | 2003-056596 A | | 7/2003 |
| KR | 1020030075890 A | | 9/2003 |
| KR | 1020050077345 A | | 8/2005 |
| KR | 2006-0052171 A | | 5/2006 |
| KR | 10-2006-0077973 | | 7/2006 |
| KR | 1020070007016 A | | 1/2007 |
| KR | 1020070021966 A | | 2/2007 |
| KR | 2007-0033748 A | | 3/2007 |
| KR | 100793946 B1 | | 1/2008 |
| KR | 1020080100025 A | | 11/2008 |
| KR | 10-2009-0046101 A | | 5/2009 |
| KR | 10-2010-0112449 A | | 10/2010 |
| TW | 200633196 | | 9/2006 |
| TW | 200643617 | | 12/2006 |
| WO | 2007/105627 A1 | | 9/2007 |
| WO | 2010/117123 A2 | | 10/2010 |

OTHER PUBLICATIONS

Taiwanese Search Report in commonly owned Taiwanese Application No. 98142271 dated Nov. 20, 2012, pp. 1.

Taiwanese Search Report in counterpart Taiwanese Application No. 98142274 dated Jan. 4, 2013, pp. 1.

Office Action in commonly owned U.S. Appl. No. 12/770,920 mailed Oct. 5, 2012, pp. 1-5.

* cited by examiner

IMAGE SENSOR AND METHOD FOR MANUFACTURING THE SAME

CROSS-REFERENCE TO RELATED APPLICATIONS

This application is a continuation-in-part of International Application No. PCT/KR2009/007055, filed on Nov. 27, 2009, pending, which designates the U.S., published as WO 2010/117123, and is incorporated herein by reference in its entirety. This application also claims priority to and the benefit of Korean Patent Application No. 10-2009-0030962 filed in the Korean Intellectual Property Office on Apr. 9, 2009, the entire disclosure of which is also incorporated herein by reference.

FIELD OF THE INVENTION

The present invention relates to an image sensor and a method of manufacturing the same.

BACKGROUND

An image sensor is a device including several million photoelectric conversion devices, and transfers light into an electric signal depending upon the amount of light received. The image sensor can be used in a digital input device that enables an image to be digitalized to transfer the digital image. There is an increasing demand for various security devices and digital porters including image sensor, resulting in rapid development of this technology.

The image sensor includes a pixel array in which a plurality of pixels are arranged in a matrix form, and each pixel includes a photo-sensing device and a transmitting and signal output device. The image sensor is broadly classified as a charge coupled device (CCD) image sensor or a complementary metal oxide semiconductor (CMOS) image sensor, depending upon the transmitting and signal output device.

The CMOS image sensor concentrates the outside light through a microlens, and the concentrated light is transmitted to the photo-sensing device such as a photodiode, which outputs a signal.

The CMOS image sensor is further refined to accomplish higher resolution, and recently research has focused on decreasing the pixel size to 1 μm or less.

The size of the microlens can also be decreased to reduce the pixel size. This, however, can generate crosstalk between adjacent pixels, which can deteriorate the resolution unless the focus distance of the lens is decreased.

SUMMARY OF THE INVENTION

One embodiment provides an image sensor that can prevent crosstalk between adjacent pixels and/or can increase resolution by improving photo-sensing efficiency.

Another embodiment provides a method of manufacturing the image sensor.

According to one embodiment, an image sensor is provided that includes a photo-sensing device, a color filter positioned on the photo-sensing device, a microlens positioned on the color filter, an insulation layer positioned between the photo-sensing device and the color filter and including a trench exposing the photo-sensing device, and a filler filled in the trench. The filler has light transmittance of about 85% or more at a visible ray region and a higher refractive index than the insulation layer.

The filler has a refractive index that is about 1.1 to about 1.5 times higher than that of the insulation layer.

The insulation layer may include silicon oxide, SiC, SiCOH, SiCO, SiOF, or a combination thereof.

The filler may have a refractive index of about 1.6 to about 1.85.

The filler may be a polymer of a compound represented by the following Chemical Formula 1.

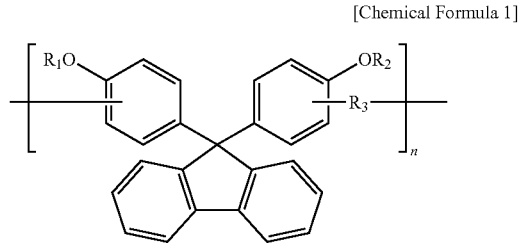

[Chemical Formula 1]

In the above Chemical Formula 1, $3 \leq n < 190$, $R_1$ and $R_2$ are the same or different and are independently hydrogen, substituted or unsubstituted C1 to C10 alkyl, substituted or unsubstituted C3 to C12 cycloalkyl, substituted or unsubstituted C6 to C12 aryl, substituted or unsubstituted C3 to C12 heteroaryl, or a combination thereof, and $R_3$ is substituted or unsubstituted C2 to C10 alkylene, substituted or unsubstituted C3 to C12 cycloalkylene, substituted or unsubstituted C6 to C12 arylene, substituted or unsubstituted C3 to C12 heteroarylene, or a combination thereof.

The trench may have an aspect ratio of about 1.8 to about 4.

The trench may have a width of about 0.8 to about 1.2 times that of the photo-sensing device.

According to another embodiment, a method of manufacturing an image sensor is provided that includes providing a photo-sensing device, providing an insulation layer on the photo-sensing device, providing a trench in the insulation layer, filling the trench with a filler including a fluorene-based compound, providing a color filter on the insulation layer and the filler, and providing a microlens on the color filter.

The fluorene-based compound may be represented by the above Chemical Formula 1, and can have a weight average molecular weight (Mw) of about 4000 to about 30,000.

The filler may further include a cross-linking agent, an acid catalyst, and an organic solvent.

The method may further include curing the filler after filling the filler. The filler may have a refractive index of about 1.6 to about 1.85, and light transmittance of about 85% or more at a visible ray region.

The light concentrating efficiency can be increased to prevent light leakage to an adjacent pixel. Accordingly, it is possible to provide an image sensor having high resolution and the light efficiency sensed by the photo-sensing device can be increased.

DETAILED DESCRIPTION

Figure 1:
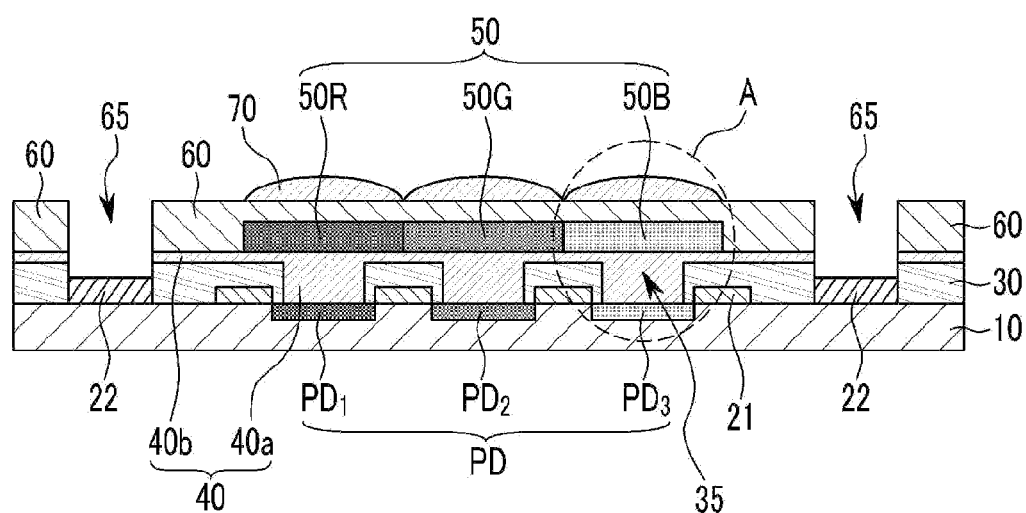
FIG. 1 is a cross-sectional view of a CMOS image sensor according to one embodiment.

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a definition is not otherwise provided, the term "substituted" refers to one substituted with a substituent including halogen (F, Br, Cl, or I), hydroxy, alkoxy, nitro, cyano, amino ($NH_2$, $NH(R^{100})$ or $N(R^{101})(R^{102})$, wherein $R^{100}$, $R^{101}$, and $R^{102}$ are the same or different and are each independently C1 to C10 alkyl), azido, amidino, hydrazino, hydrazono, carbonyl, carbamyl, thiol, ester, carboxyl or a salt thereof, sulfonic acid group or a salt thereof, phosphoric acid group or a salt thereof, C1 to C20 alkyl, C2 to C16 alkenyl, C2 to C16 alkynyl, C6 to C30 aryl, C7 to C13 arylalkyl, C1 to C4 oxyalkyl, C1 to C20 heteroalkyl, C3 to C20 heteroarylalkyl, C3 to C20 cycloalkyl, C3 to C15 cycloalkenyl, C6 to C15 cycloalkynyl, C2 to C20 heterocycloalkyl, or a combination thereof.

As used herein, when a definition is not otherwise provided, the term "hetero" refers to one including 1 to 3 heteroatoms including N, O, S, P or a combination thereof.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, referring to FIG. 1, an image sensor according to one embodiment is described.

FIG. 1 is a cross-sectional view of a CMOS image sensor according to one embodiment.

In FIG. 1, a red pixel, a green pixel, and a blue pixel adjacent to each other are exemplary described, but are not limited thereto. Referring to FIG. 1, the photo-sensing device (PD) and transmitting transistor (not shown) are integrated on a semiconductor substrate 10. The photo-sensing device (PD) may include a photodiode. The photo-sensing device (PD) and the transmitting transistor are integrated in each pixel. As shown in the drawing, the photo-sensing device (PD) includes a photo-sensing device $PD_1$ of a red pixel, a photo-sensing device $PD_2$ of a green pixel, and a photo-sensing device $PD_3$ of a blue pixel. The photo-sensing device (PD) senses the light, and the sensed information by the photo-sensing device (PD) is transported by the transmitting transistor.

In addition, a metal line 21 and a pad 22 are formed on the substrate 10. The metal line 21 and the pad 22 may be made of a metal having a low resistivity such as but not limited to aluminum (Al), copper (Cu), silver (Ag), or an alloy thereof to decrease the signal delay.

A lower insulation layer 30 is formed on the metal line 21 and the pad 22. The lower insulation layer 30 may be made of an inorganic insulating material such as silicon oxide ($SiO_2$), or a low dielectric constant (low-k) material such as but not limited to SiC, SiCOH, SiCO, or SiOF.

The lower insulation layer 30 has a trench 35 exposing each photo-sensing device $PD_1$, $PD_2$, and $PD_3$ of each pixel. The trench 35 is formed to provide an aspect ratio of about 1.8 to about 4, for example, it may have a width of about 0.5 to about 0.8 μm and a height of about 1.5 to about 2 μm. The trench 35 is formed to provide a width of about 0.8 to about 1.2 times that of each photo-sensing device $PD_1$, $PD_2$, and $PD_3$ of the pixel in order to prevent light crosstalk and to effectively sense light.

A filler 40 is formed in the trench 35. The filler 40 includes a thick portion 40a filling each trench 40 and a thin portion 40b formed on the insulation layer 30. However, a thin portion 40b of the filler 40 may be removed depending upon the manufacturing method.

The filler 40 has a higher refractive index than the insulation layer 30. For example, the filler 40 may have a refractive index of about 1.1 to about 1.5 times that of the insulation layer 30. For example, when the insulation layer 30 includes silicon oxide having a refractive index of about 1.45 to about 1.5, the filler 40 may have a refractive index of about 1.6 to about 1.85.

The filler 40 has light transmission of about 85% or more at a visible ray region.

The filler 40 having the high refractive index and the high light transmission may include a fluorene-based compound.

The fluorene-based compound may include a polymer of a compound represented by Chemical Formula 1.

[Chemical Formula 1]

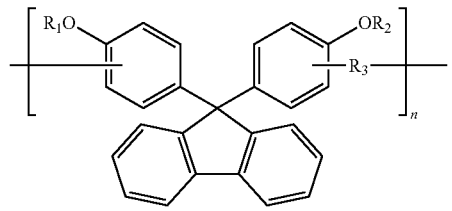

In the above Chemical Formula 1, $3 \leq n < 190$, $R_1$ and $R_2$ are the same or different and are independently hydrogen, substituted or unsubstituted C1 to C10 alkyl, substituted or unsubstituted C3 to C12 cycloalkyl, substituted or unsubstituted C6 to C12 aryl, substituted or unsubstituted C3 to C12 heteroaryl, or a combination thereof, and $R_3'$ is substituted or unsubstituted C2 to C10 alkylene, substituted or unsubstituted C3 to C12 cycloalkylene, substituted or unsubstituted C6 to C12 arylene, substituted or unsubstituted C3 to C12 heteroarylene, or a combination thereof.

The filler may be prepared in a solution further including a cross-linking agent, an acid catalyst, and an organic solvent in addition to the fluorene-based compound. The solution may be cured by a method such as thermal curing to provide a filler having a high refractive index and transmission. Examples of the cross-linking agent include an amino resin, e.g., an etherificated amino resin; a glycoluril compound, e.g., a compound represented by the following Chemical Formula A (Powderlink 1174); an urea resin such as Cymel U-65 and UFR 80 Resin; a bisepoxy compound, e.g., a compound represented by the following Chemical Formula B; a melamine resin, for example, N-methoxymethyl melamine resin, N-butoxymethyl melamine resin, or a compound represented by the following Chemical Formula C; 2,6-bis(hydroxymethyl)-p-cresol compound; or a mixture thereof.

[Chemical Formula A]

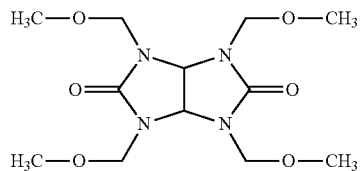

[Chemical Formula B]

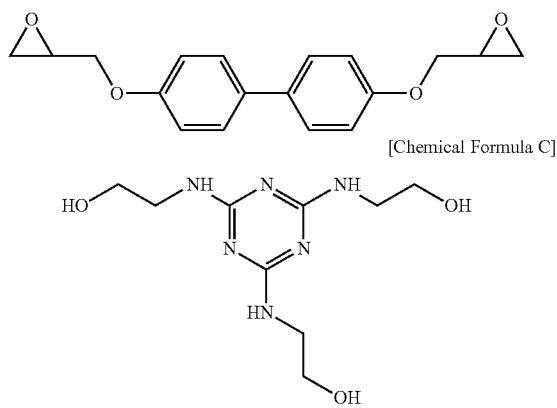

[Chemical Formula C]

The cross-linking agent may be included in an amount of about 0.1 parts by weight to about 5 parts by weight based on 100 parts by weight of the solution.

Examples of the acid catalyst may include at least one selected from p-toluenesulfonic acid mono hydrate, pyridinium p-toluene sulfonate, 2,4,4,6-tetrabromocyclohexadienone, benzoin tosylate, 2-nitrobenzyl tosylate and alkyl ester of organic sulfonic acid. The acid catalyst may be included in an amount of about 0.001 parts by weight to about 0.05 parts by weight based on 100 parts by weight of the solution.

Examples of the organic solvent may include at least one selected from propyleneglycol monomethyletheracetate (PGMEA), propyleneglycol monomethylether (PGME), cyclohexanone, ethyl lactate, γ-butyrolactone (GBL), and acetyl acetone. The organic solvent may be included in an amount of about 80 wt % to about 99 wt % based on total amount of the solution.

A color filter 50 is positioned on the filler 40. The color filter 50 includes a red filter 50R formed on the red pixel, a green filter 50G formed on the green pixel, and a blue filter 50B formed on the blue pixel. The red filter 50R, the green filter 50G, and the blue filter 50B are respectively positioned on a photo-sensing device PD₁ of a red pixel, a photo-sensing device PD₂ of a green pixel, and a photo-sensing device PD₃ of a blue pixel.

An upper insulation layer 60 is formed on the color filter 50. The upper insulation layer 60 removes a step due to the color filter 50 and smoothes the same. The upper insulation layer 60 and the lower insulation layer 30 have a contact hole 65 exposing the pad 22.

A microlens 70 is formed on the upper insulation layer 60 in the position corresponding to each color filter 50R, 50G, and 50B of the pixels. The microlens 70 concentrates light coming from the outside.

Figure 2:
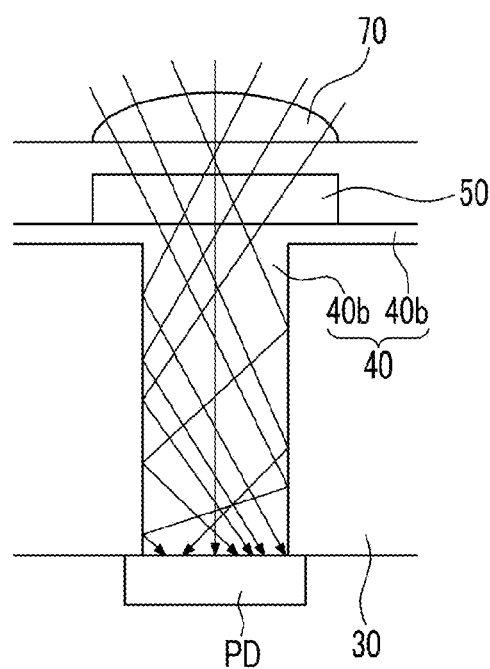
FIG. 2 is a schematic diagram enlarging the "A" portion of the image sensor of FIG. 1.

Referring to FIG. 2, the principal of the image sensor according to one embodiment of the present invention is schematically described.

FIG. 2 is a schematic diagram enlarging the "A" portion of the image sensor of FIG. 1.

The "A" portion of FIG. 1 refers to a unit cell of an image sensor.

Referring to FIG. 2, the light concentrated from the microlens 70 is passed through the color filter 50 and then reflected several times in the trench 35 by total reflection, so it is gathered into a photo-sensing device (PD). The total reflection is generated by a refractive index difference between the filler 40 and the insulation layer 30. When the reflective index difference is increased, the total reflection is more effective.

The light concentrated from the microlens 70 in the unit pixel is flowed into a photo-sensing device (PD) positioned in the pixel through the total reflection, so the light concentrating efficiency is increased to prevent light leakage to an adjacent pixel. Accordingly, it is possible to provide an image sensor having high resolution.

Furthermore, it prevents the light loss by the filler 40 that is filled in the trench 35 and has high light transmittance of about 85% or more, so the light efficiency sensed to the photo-sensing device is increased.

The method of manufacturing the CMOS image sensor shown in FIG. 1 is described with reference to FIG. 3.

Figure 3:
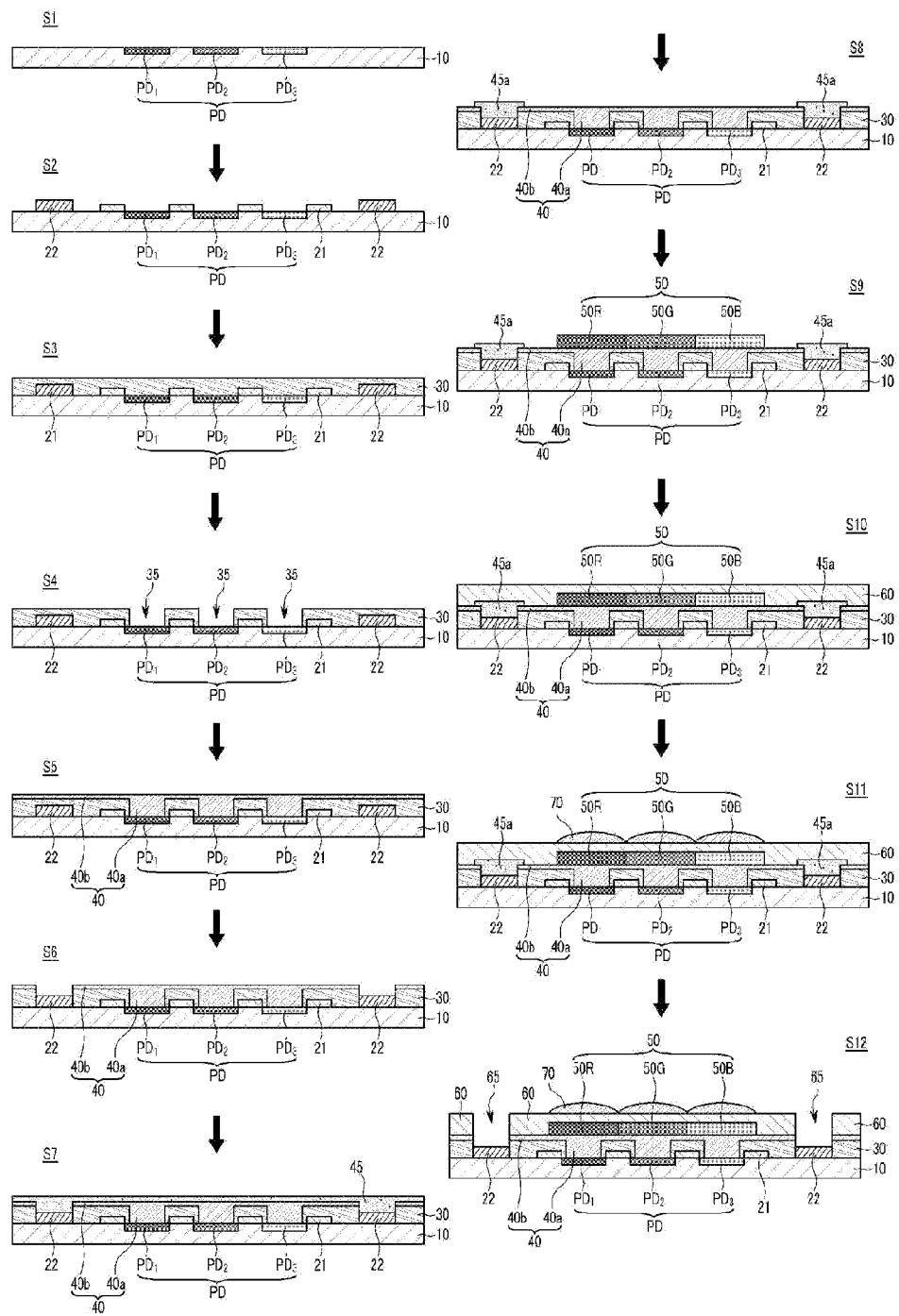
FIG. 3 is a cross-sectional view sequentially showing a process of manufacturing the CMOS image sensor of FIG. 1.

FIG. 3 is a cross-sectional view sequentially showing a process of manufacturing the CMOS image sensor of FIG. 1.

First, a photo-sensing device (PD) is formed on each pixel of the semiconductor substrate 10 (S1). The photo-sensing device (PD) may be formed in accordance with generally well-known methods including providing an impurity region, so a detailed description will be omitted.

Then a metal layer is laminated on the semiconductor substrate 10 and subjected to photolithography to provide a metal line 21 and a pad 22 having a predetermined pattern (S2).

Then a lower insulation layer 30 is formed on the front surface of the substrate (S3). The lower insulation layer 30 may be formed in accordance with a method such as chemical vapor deposition (CVD) or a solution process such as spin coating, slit coating, Inkjet printing, and the like.

Subsequently, a trench 35 is formed on the lower insulation layer 30 to expose each photo-sensing device PD₁, PD₂, and PD₃ (S4). The trench 35 may be formed in accordance with the photolithography process.

A filler is coated on the substrate (S5). The filler 40 may be formed as a solution.

The filler 40 may include a fluorene-based compound.

The fluorene-based compound may include a compound represented by Chemical Formula 1.

[Chemical Formula 1]

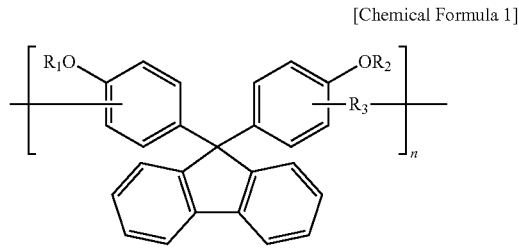

In the above Chemical Formula 1, 3≦n<190, R₁ and R₂ are the same or different and are independently hydrogen, substituted or unsubstituted C1 to C10 alkyl, substituted or unsubstituted C3 to C12 cycloalkyl, substituted or unsubstituted C6 to C12 aryl, substituted or unsubstituted C3 to C12 heteroaryl, or a combination thereof, and R₃ is substituted or unsubstituted C2 to C10 alkylene, substituted or unsubstituted C3 to C12 cycloalkylene, substituted or unsubstituted C6 to C12 arylene, substituted or unsubstituted C3 to C12 heteroarylene, or a combination thereof.

The fluorene-based compound may have a weight average molecular weight (Mw) of about 4000 to about 30,000. When the molecular weight is within the above range, flatness and filling property of a film using the compound may be improved.

The filler may further include a cross-linking agent, an acid catalyst, and an organic solvent besides the fluorene-based compound.

The filler 40 can have high light transmission of about 85% or more as well as a high refractive index of about 1.6 to about 1.85. The filler may have substantially the same refractive index and light transmission both in the solution state and in the cured state. In addition, the filler can have an excellent filling property regarding the trench having a high aspect ratio, so that can be efficiently filled into a fine trench so as to achieve good planarity. In addition, the filler 40 can have an excellent thermosetting property at a temperature of, for example, about 200 to about about 300° C., which can also be beneficial to form a layer, and can have excellent chemical resistance. Accordingly, it is possible to prevent degeneration caused by the chemicals that are used to form other layers.

The filler 40 may be coated in accordance with the solution process such as but not limited to spin coating, slit coating, and Inkjet printing.

Then the coated filler 40 is thermally cured. The thermosetting process may be performed at a temperature of about 200 to about 400° C. for about 120 to about 180 seconds.

The cured filler 40 includes a thick portion 40a filled in the trench 35 and a thin portion 40b formed on the lower insulation layer 30. The thick portion 40a may be closely filled without voids, and the thin portion 40b may be smoothly formed on the surface thereof. Subsequently, the filler 40 and lower insulation layer 30 are partially removed to expose a pad 22 (S6). The filler 40 and the lower insulation layer 30 may be removed by wet etching.

Then a pad protective layer 45 is formed on the front surface of the substrate (S7).

Subsequently, the pad protective layer 45 is subjected to photolithography to leave a pad protective layer 45a only on the pad 22 and remove the other parts (S8).

Each color filter 50R, 50G, and 50B is respectively formed on the filler 40 in a position corresponding to each photosensing device $PD_1$, $PD_2$, and $PD_3$ (S9). The red filter 50R, the green filter 50G, and the blue filter 50B may be sequentially formed using an i-line stepper. However, the color filter 50R, 50G, and 50B may be formed by various methods, and the forming order is also changeable.

Then an upper insulation layer 60 is formed on the front surface of substrate including color filter 50R, 50G, and 50B (S10). The upper insulation layer 60 may be formed in accordance with a solution process such as but not limited to spin coating, slit coating, and Inkjet printing.

A microlens 70 is formed on each color filter 50R, 50G, and 50B (S11).

Lastly, the upper insulation layer 60, the thin portion 40b of the filler 40, the lower insulation layer 30, and the pad protective layer 45a disposed on the pad 22 are removed to expose the pad 22 (S12). Selectively, an ashing treatment may be carried out using oxygen gas ($O_2$).

Hereinafter, the embodiments are illustrated in more detail with reference to examples. However, the following are exemplary embodiments and are not limiting.

Synthesis of Filler Polymer

Synthesis Example 1

8.75 g (0.05 mol) of α,α'-dimethoxy-p-xylene, 26.66 g of aluminum chloride, and 200 g of γ-butyrolactone are introduced into a 1 l 4-neck flask mounted with a mechanical stirrer, a condenser, a 300 ml dropping funnel, and a nitrogen gas-introduction tube with inflowing nitrogen gas, and sufficiently stirred. After 10 minutes, a solution in which 35.03 g (0.10 mol) of 4,4'-(9-fluorenylidene)diphenol is dissolved in 200 g of γ-butyrolactone is slowly dripped for 30 minutes and reacted for 12 hours. After completing the reaction, the acid is removed using water and condensed by an evaporator. Then it is diluted using methylamylketone (MAK) and methanol to provide a solution of MAK/methanol=4/1 (weight ratio) in a concentration of 15 wt %. The solution is introduced into a 3l separate funnel and added with n-heptane to remove a low molecular body including a monomer. A polymer (Mw=10,000, polydispersity=2.0) represented by the following Chemical Formula 1A is provided.

[Chemical Formula 1A]

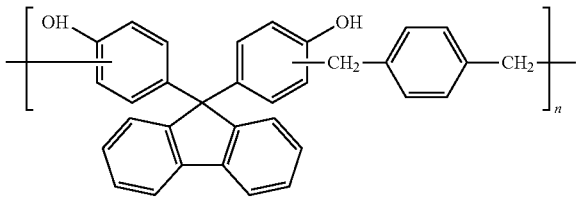

Synthesis Example 2

A polymer (Mw=7600) represented by the following Chemical Formula 1B is prepared in accordance with the same procedure as in Synthesis Example 1, except that formaldehyde is used instead of α,α'-dimethoxy-p-xylene.

[Chemical Formula 1B]

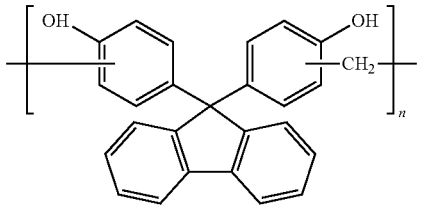

Synthesis Example 3

A polymer (Mw=5000) represented by the following Chemical Formula 1C is prepared in accordance with the same procedure as in Synthesis Example 1, except that benzaldehyde is used instead of α,α'-dimethoxy-p-xylene.

[Chemical Formula 1C]

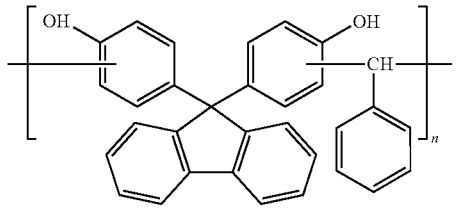

Synthesis Example 4

A polymer (Mw=5800) represented by the following Chemical Formula 1D is prepared in accordance with the same procedure as in Synthesis Example 1, except that 4-hydroxybenzaldehyde is used instead of α,α'-dimethoxy-p-xylene.

[Chemical Formula 1D]

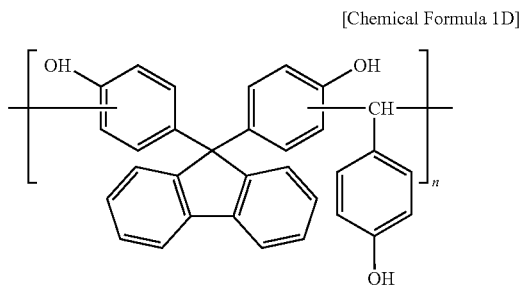

Synthesis Example 5

A polymer (Mw=4300) represented by the following Chemical Formula 1E is prepared in accordance with the same procedure as in Synthesis Example 1, except that α,α'-dimethoxy-p-biphenyl is used instead of α,α'-dimethoxy-p-xylene.

[Chemical Formula 1E]

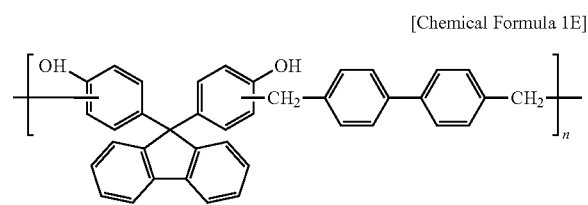

Comparative Synthesis Example 1

50 g (0.17 mol) of 4,4'-oxydiphthalicanhydride, 28.35 g (0.14 mol) of 4,4'-diaminodiphenylether, and 6.8 g (0.04 mol) of norborene-2,3-dicarboxylicanhydride are introduced into a 1 l 4-neck flask mounted with a mechanical stirrer, a condenser, a 300 ml dropping funnel, and a nitrogen gas-introduction tube with inflowing nitrogen gas, and mixed with 700 g of an NMP solvent and stirred. It is heated to 80° C. and agitated for 3 hours to carry out the reaction. After carrying out the reaction for 3 hours and dripping the NMP reaction solution in 7 l of water for one hour, it is agitated for 30 minutes and filtered with a Buchner funnel to provide a polyimide (Mw=10,000, polydispersity=2.1).

The refractive index and transmission of the polymers obtained from Synthesis Examples 1 to 5 and Comparative Synthesis Example 1 are measured. The refractive index is measured at 633 nm, and the transmission is measured at a visible ray region of 400 to 800 nm. The refractive index and light transmission of the polymer are considered as substantially the same in both the solution and cured states.

The results are shown in Table 1.

TABLE 1

|  | Refractive index | Transmission (%) |
|---|---|---|
| Synthesis Example 1 | 1.68 | 96 |
| Synthesis Example 2 | 1.63 | 94 |
| Synthesis Example 3 | 1.65 | 90 |

TABLE 1-continued

|  | Refractive index | Transmission (%) |
|---|---|---|
| Synthesis Example 4 | 1.65 | 88 |
| Synthesis Example 5 | 1.71 | 85 |
| Comparative Synthesis Example 1 | 1.68 | 60 |

As shown in Table 1, the polymers obtained from Synthesis Examples 1 to 5 have a high refractive index of 1.6 or more and high transmission of 85% or more. On the other hand, the polyimide compound according to Comparative Synthesis Example 1 has lower transmission than that of Synthesis Examples 1 to 5.

Manufacturing Filler

A filler is prepared as in the following Examples 1 to 11 using the polymers represented by Chemical Formula 1A to Chemical Formula 1E obtained from Synthesis Examples 1 to 5.

Example 1

1.0 g of the polymer (Mw=10,000) represented by Chemical Formula 1A obtained from Syntheses Example 1 is weighed, and 0.05 g of a cross-linking agent (L-145, manufactured by CYTEC) represented by the following Chemical Formula 2 and 0.01 g of pyridinium p-toluene sulfonate are added and dissolved in 8 g of propylene glycol monomethyl ether acetate (PGMEA) and filtered to provide a filler.

[Chemical Formula 2]

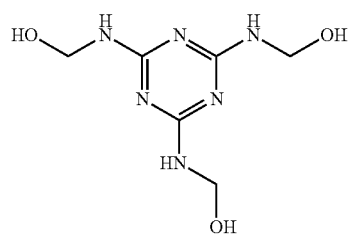

Example 2

A filler is prepared in accordance with the same procedure as in Example 1, except that the polymer (Mw=5000) represented by Chemical Formula 1A having the different molecular weight is used instead of the polymer of Example 1.

Example 3

A filler is prepared in accordance with the same procedure as in Example 1, except that the cross-linking agent (Powderlink 1174, manufactured by CYTEC) represented by the following Chemical Formula 3 is used instead of the cross-linking agent represented by Chemical Formula 2.

[Chemical Formula 3]

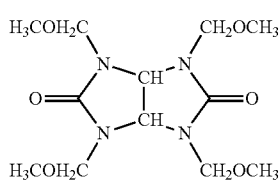

Example 4

A filler is prepared in accordance with the same procedure as in Example 1, except that the cross-linking agent is not used.

Example 5

A filler is prepared in accordance with the same procedure as in Example 1, except that the polymer (Mw=7600) represented by Chemical Formula 1B obtained from Synthesis Example 2 is used instead of the polymer obtained from Synthesis Example 1.

Example 6

A filler is prepared in accordance with the same procedure as in Example 5, except that the polymer (Mw=22,000) represented by Chemical Formula 1B having a different molecular weight is used instead of the polymer of Example 5.

Example 7

A filler is prepared in accordance with the same procedure as in Example 1, except that the polymer (Mw=5000) represented by Chemical Formula 1C obtained from Synthesis Example 3 is used instead of the polymer obtained from Synthesis Example 1.

Example 8

A filler is prepared in accordance with the same procedure as in Example 7, except that the polymer (Mw=11,000) represented by Chemical Formula 1C having a different molecular weight is used instead of the polymer of Example 7.

Example 9

A filler is prepared in accordance with the same procedure as in Example 1, except that the polymer (Mw=5800) represented by Chemical Formula 1D obtained from Synthesis Example 4 is used instead of the polymer obtained from Synthesis Example 1.

Example 10

A filler is prepared in accordance with the same procedure as in Example 9, except that the polymer (Mw=12,500) represented by Chemical Formula 1D having a different molecular weight is used instead of the polymer of Example 9.

Example 11

A filler is prepared in accordance with the same procedure as in Example 1, except that the polymer (Mw=4300) represented by Chemical Formula 1E obtained from Synthesis Example 5 is used instead of the polymer obtained from Synthesis Example 1.

Comparative Example 1

A filler is prepared in accordance with the same procedure as in Example 1, except that the polymer (Mw=10,000) obtained from Comparative Synthesis Example 1 is used.

Evaluation 1

Each filler obtained from Examples 1 to 11 is coated on a wafer for a CMOS image sensor formed with a 0.8 μm×2.0 μm trench in accordance with a spin coating method and cured at 200° C. for 5 minutes.

The filler is measured for trench filling property, film planarity, and chemical resistance. The trench filling property and film planarity are measured using a scanning electron microscope (SEM), and the chemical resistance is measured by dipping the wafer into each of trimethylammonium hydroxide (TMAH) (2.35%), isopropyl alcohol (IPA), propylene glycol monomethylether acetate (PGMEA), and acetone for one minute, and the thickness change is measured using KST4000-DLX® (manufactured by KMAC). The results are shown in Table 2.

TABLE 2

| | Trench filling property | Film planarity | Chemical resistance (thickness difference, Å/min) | | | |
|---|---|---|---|---|---|---|
| | | | TMAH | IPA | PGMEA | Acetone |
| Example 1 | ⊚ | ⊚ | 0.3 | 0.2 | 1.2 | 0.3 |
| Example 2 | ⊚ | ○ | 1.3 | 1.6 | 1.2 | 2.0 |
| Example 3 | ⊚ | ○ | 0.7 | 0.5 | 1.0 | 0.7 |
| Example 4 | ⊚ | ⊚ | 2.2 | 1.0 | 2.1 | 2.0 |
| Example 5 | ○ | ○ | 0.5 | 3.5 | 3.1 | 3.7 |
| Example 6 | ○ | ○ | 0.5 | 3.0 | 2.8 | 2.8 |
| Example 7 | ○ | ○ | 0.3 | 0.2 | 1.2 | 0.3 |
| Example 8 | ○ | ○ | 0.4 | 0.2 | 1.3 | 1.2 |
| Example 9 | ⊚ | ○ | 1.5 | 2.2 | 2.4 | 2.0 |
| Example 10 | ○ | ○ | 8.2 | 2.2 | 1.7 | 1.6 |
| Example 11 | ⊚ | ○ | 0.3 | 1.4 | 0.5 | 2.0 |
| Comparative Example 1 | X | X | 1.3 | 1.8 | 2.8 | 1.4 |

In Table 2, for rating the trench filling property, ⊚ indicates that all the trench is well filled, ○ indicates that the trench is partially not filled, and × indicates that none of the trench is filled. For rating the film planarity, the film surface step is measured by using an atomic force microscope (AFM), and ⊚ indicates having a step of 100 nm or less, ○ indicates having a step of 100 nm to 1 μm, and × indicates having a step of 1 μm or more.

As shown in Table 2, it is understood that when the layer is made using the filler according to the exemplary embodiment of the' present invention, it is possible to provide good characteristics such as trench filling property, film planarity, and chemical resistance. On the other hand, when the layer is made using polyimide, the trench filling property and film are poor, and the chemical resistance to each solvent is deteriorated.

Evaluation 2

A CMOS image sensor including a plurality of pixels having a size of about 1.4 μm is fabricated in accordance with the same method as in the above embodiment. It includes the filler obtained in each of Examples 1, 3, 5, 7, 9, and 11 and Comparative Example 1. In addition, as Comparative Example 2, the conventional CMOS image sensor formed with no trench or filler is fabricated.

The obtained CMOS image sensors are measured to determine the luminance of unit pixels using T-10M illuminometer (manufactured by Konica-Minolta Co. Ltd.).

The results are shown in Table 3.

TABLE 3

| No. | Luminance (lux) |
|---|---|
| Example 1 | 175 |
| Example 3 | 170 |
| Example 5 | 154 |
| Example 7 | 160 |
| Example 9 | 165 |
| Example 11 | 165 |
| Comparative Example 1 | 136 |
| Comparative Example 2 | 150 |

As shown in Table 3, it is confirmed that when the trench is formed on the photosensitive device of the CMOS image sensor and the trench is filled with a filler according to an exemplary embodiment, the light amount inflow into each pixel is increased compared to the case of Comparative Example 1 including a filler of polyimide and the case of Comparative Example 2 including no trench or filler. It is also confirmed that the concentrated light from the microlens is flowed into the corresponding light sensing device through the filler having a high refractive index and a high transmission according to the exemplary embodiments of the present invention, so as to increase the light efficiency. This means that the light efficiency sensed by the photo-sensing device of the corresponding pixel is increased to improve the light efficiency of the CMOS image sensor.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

That which is claimed is:

1. An image sensor comprising:
  a photo-sensing device;
  a color filter positioned on the photo-sensing device;
  a microlens positioned on the color filter;
  an insulation layer positioned between the photo-sensing device and the color filter, and including a trench exposing the photo-sensing device; and
  a filler filled in the trench,
  wherein the filler has light transmittance of about 85% or more at a visible ray region and a higher refractive index than the insulation layer, and
  wherein the filler comprises a polymer of a compound represented by the following Chemical Formula 1:

[Chemical Formula 1]

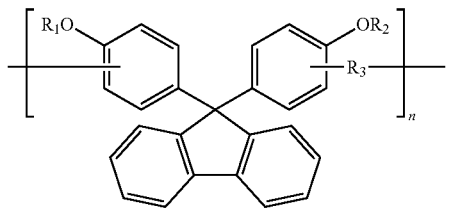

wherein, in the above Chemical Formula 1, $3 \leq n < 190$, $R_1$ and $R_2$ are the same or different and are independently hydrogen, substituted or unsubstituted C1 to C10 alkyl, substituted or unsubstituted C3 to C12 cycloalkyl, a substituted or unsubstituted C6 to C12 aryl, substituted or unsubstituted C3 to C12 heteroaryl, or a combination thereof, and $R_3$ is substituted or unsubstituted C2 to C10 alkylene, substituted or unsubstituted C3 to C12 cycloalkylene, substituted or unsubstituted C6 to C12 arylene, substituted unsubstituted C3 to C12 heteroarylene, or a combination thereof.

2. The image sensor of claim 1, wherein the filler has a refractive index that is about 1.1 to about 1.5 times higher than a refractive index of the insulation layer.

3. The image sensor of claim 2, wherein the insulation layer comprises silicon oxide, SiC, SiCOH, SiCO, SiOF, or a combination thereof.

4. The image sensor of claim 1, wherein the filler has a refractive index of about 1.6 to about 1.85.

5. The image sensor of claim 1, wherein the trench has an aspect ratio of about 1.8 to about 4.

6. The image sensor of claim 1, wherein the trench has a width of about 0.8 to about 1.2 times that of the photo-sensing device.

7. A method of manufacturing an image sensor, comprising:
  providing a photo-sensing device;
  providing an insulation layer on the photo-sensing device;
  providing a trench in the insulation layer;
  filling the trench with a filler including a fluorene-based compound;
  providing a color filer on the insulation layer and the filler; and
  providing a microlens on the color filter,
  wherein the fluorene-based compound is represented by the following Chemical Formula 1:

[Chemical Formula 1]

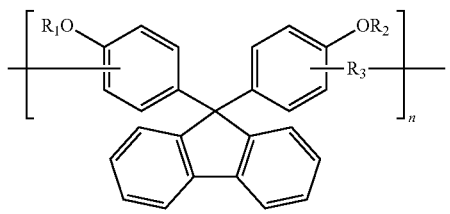

wherein, in the above Chemical Formula 1, $3 \leq n < 190$, $R_1$ and $R_2$ are the same or different and are independently hydrogen, substituted or unsubstituted C1 to C10 alkyl, substituted or unsubstituted C3 to C12 cycloalkyl, a substituted or unsubstituted C6 to C12 aryl, substituted or unsubstituted C3 to C12 heteroaryl, or a combination thereof, and $R_3$ is substituted or unsubstituted C2 to C10 alkylene, substituted or unsubstituted C3 to C12 cycloalkylene, substituted or unsubstituted C6 to C12 arylene, substituted or unsubstituted C3 to C12 heteroarylene, or a combination thereof.

8. The method of claim 7, wherein the method further comprises curing the filler after filling the filler, and the filler has a higher refractive index than the insulation layer and light transmittance of about 85% or more at a visible ray region.

9. The image sensor of claim 1, wherein $R_1$ and $R_2$ of Chemical Formula 1 are each hydrogen.

10. The image sensor of claim 9, wherein the filler comprises a polymer of a compound represented by the following Chemical Formula 1A:

[Chemical Formula 1A]

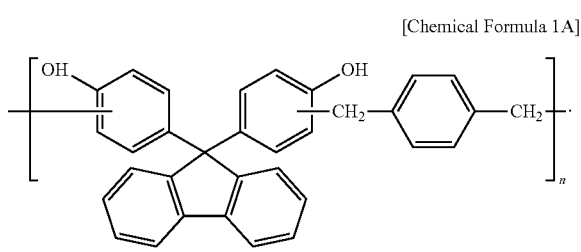

11. The image sensor of claim 9, wherein the filler comprises a polymer of a compound represented by the following Chemical Formula 1B:

[Chemical Formula 1B]

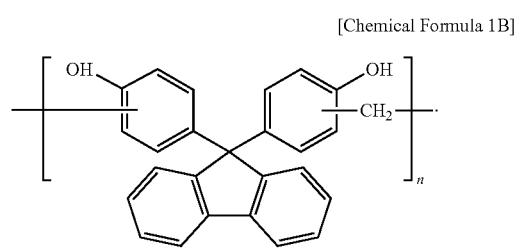

12. The image sensor of claim 9, wherein the filler comprises a polymer of a compound represented by the following Chemical Formula 1C:

[Chemical Formula 1C]

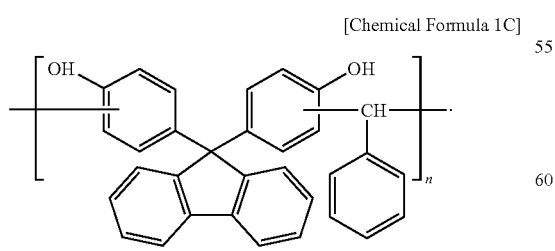

13. The image sensor of claim 9, wherein the filler comprises a polymer of a compound represented by the following Chemical Formula 1D:

[Chemical Formula 1D]

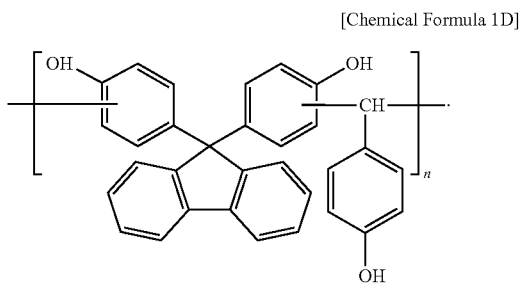

14. The image sensor of claim 9, wherein the filler comprises a polymer of a compound represented by the following Chemical Formula 1E:

[Chemical Formula 1E]

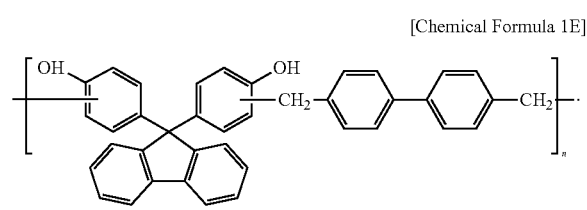

15. The method of claim 7, wherein $R_1$ and $R_2$ of Chemical Formula 1 are each hydrogen.

16. The method of 15, wherein the filler comprises a polymer of one or more compounds selected from the group consisting of the following Chemical Formula 1A-1E:

[Chemical Formula 1A]

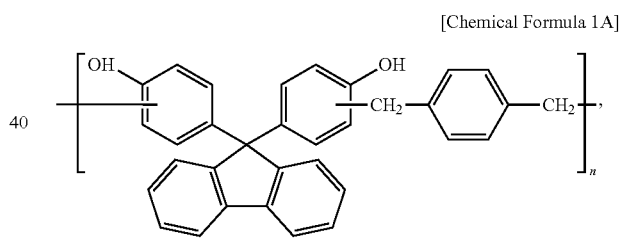

,

[Chemical Formula 1B]

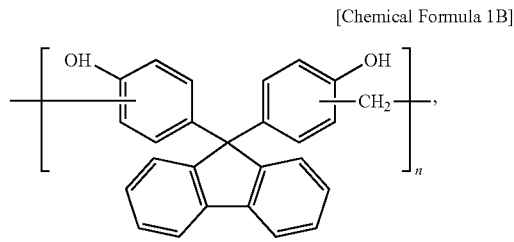

,

[Chemical Formula 1C]

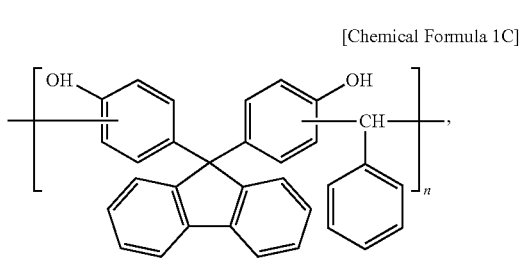

,

-continued
[Chemical Formula 1D]
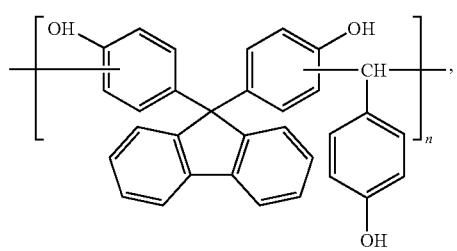
and
[Chemical Formula 1E]
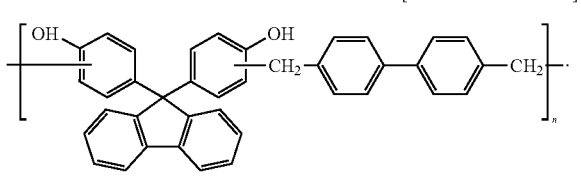
* * * * *